(12) United States Patent
Chu et al.

(10) Patent No.: US 7,437,689 B2
(45) Date of Patent: Oct. 14, 2008

(54) INTERCONNECT MODEL-ORDER REDUCTION METHOD

(75) Inventors: Chia-Chi Chu, Kwei-Shan (TW);
Herng-Jer Lee, Kwei-Shan (TW);
Wu-Shiung Feng, Kwei-Shan (TW);
Chao-Kai Chang, Kwei-Shan (TW)

(73) Assignee: Chang Gung University, Kwei-Shan (TW)

( * ) Notice: Subject to any disclaimer, the term of this patent is extended or adjusted under 35 U.S.C. 154(b) by 269 days.

(21) Appl. No.: 11/199,026

(22) Filed: Aug. 8, 2005

(65) Prior Publication Data
US 2007/0033549 A1    Feb. 8, 2007

(51) Int. Cl.
*G06F 17/50* (2006.01)
(52) U.S. Cl. .................................. 716/2; 716/1; 716/5
(58) Field of Classification Search .............. 716/1, 716/2, 5; 713/2, 14; 703/14
See application file for complete search history.

(56) References Cited

U.S. PATENT DOCUMENTS

| | | | | |
|---|---|---|---|---|
| 6,023,573 | A | 2/2000 | Bai et al. ............... | 395/500.23 |
| 6,041,170 | A | 3/2000 | Feldmann et al. ...... | 395/500.23 |
| 6,687,658 | B1 | 2/2004 | Roychowdhury ............... | 703/2 |
| 6,810,506 | B1 | 10/2004 | Levy ............................ | 716/2 |
| 2005/0235023 | A1* | 10/2005 | Lee et al. .................... | 708/304 |
| 2006/0100831 | A1* | 5/2006 | Lee et al. ....................... | 703/2 |
| 2006/0282799 | A1* | 12/2006 | Chu et al. ....................... | 716/2 |

OTHER PUBLICATIONS

Pillage, L. T. and Rohrer, R. A., "Asymptotic Waveform Evaluation for Timing Analysis", IEEE Transactions on Computer-Aided Design, vol. 9, No. 4, Apr. 1990, pp. 352-366.
Grimme, E. J., "Krylov Projection Methods for Model Reduction", University of Illinois Urbana-Champaign, 1997, pages cover p. 213.
Feldmann, P. and Freund, R. W., "Efficient Linear Circuit Analysis by Padé Approximation via the Lanczos Process", IEEE Transactions on Computer-Aided Design of Integrated Circuits and Systems, vol. 14, No. 5, May 1995, pp. 639-649.

(Continued)

*Primary Examiner*—Vuthe Siek
(74) *Attorney, Agent, or Firm*—Alan Kamrath; Kamrath & Associates PA

(57) ABSTRACT

An interconnect model-order reduction method reduces a nano-level semiconductor interconnect network as an original interconnect network by using iteration-based Arnoldi algorithms. The method is performed based on a projection method and has become a necessity for efficient interconnect modeling and simulations. To select an order of the reduced-order model that can efficiently reflect essential dynamics of the original interconnect network, a residual error between transfer functions of the original interconnect network and the reduced interconnect model may be considered as a reference in determining if the iteration process should end, with analytical expressions of the residual error being derived herein. Furthermore, the approximate transfer function of the reduced interconnect model may also be expressed as an addition of the original interconnect model and some additive perturbations. A perturbation matrix is only related with resultant vectors at a previous step of the Arnoldi algorithm. Therefore, the residual error information may be taken as a reference for the order selection scheme used in Krylov subspace model-order algorithm.

4 Claims, 3 Drawing Sheets

OTHER PUBLICATIONS

Freund, R. W. and Feldmann, P., "The SyMPVL Algorithm and Its Applications to Interconnect Simulation", IEEE 1997, pp. 113-116.

Odabasioglu, A., Celik, M. and Pileggi, L. T., "PRIMA: Passive Reduced-Order Interconnect Macromodeling Algorithm", IEEE Transactions on Computer-Aided Design of Integrated Circuits and Systems, vol. 17, No. 8, Aug. 1998, pp. 645-654.

Odabasioglu, A., Celik, M. and Pileggi, L. T., "Practical Considerations for Passive Reduction of RLC Circuits", IEEE 1999, pp. 214-219.

Bai, Z., Slone, R. D., Smith, W. T. and Ye, Q., "Error Bound for Reduced System Model by Padé Approximation via the Lanczos Process", IEEE Transactions on Computer-Aided Design of Integrated Circuits and Systems, vol. 18, No. 2, Feb. 1999, pp. 133-141.

Freund, R. W., "Krylov-subspace methods for reduced-order modeling in circuit simulation", Bell Laboratories, Numerical Analysis Manuscript No. 99-3-17, Nov. 1999, pp. 1-36.

Wang, J. M., Chu, C.C., Yu, Q. and Kuh, E. S., "On Projection-Based Algorithms for Model-Order Reduction of Interconnects", IEEE Transactions on Circuits and Systems—I: Fundamental Theory and Applications, vol. 49, No. 11, Nov. 2002, pp. 1563-1585.

* cited by examiner

INTERCONNECT MODEL-ORDER REDUCTION METHOD

BACKGROUND OF THE INVENTION

1. Field of Invention

The present invention relates to an interconnect model-order reduction method. More particularly, the present invention relates to a rapid and accurate interconnect model-order reduction method for reduction of a nano-level semiconductor interconnect network for signal analysis.

2. Related Art

Complemented metal oxide semiconductor (CMOS) technology has heretofore advanced to be measured at a nano-level, and, thus, the parasitic effect to interconnects of the related semiconductor device cannot be neglected. Since the complexity of a circuit associated with the semiconductor device is increased, the order of the corresponding interconnect model is also increased. Consequently, an efficient interconnect model-order reduction has become a necessity of modeling and simulation of the interconnect network. Such methods may be referred to in, for example, U.S. Pat. Nos. 6,023,573, 6,041,170 and 6,687,658. These circuit model-order reduction methods set forth in recent years are herein summarized as follows. 1. Asymptotic waveform evaluation (AWE), which was set forth in an article by L. T. Pillage and R. A. Rohrer, entitled "Asymptotic waveform evaluation for timing analysis," IEEE Trans. on Computer-Aided Design of Integrated Circuits and Systems, Vol. 9, No. 4, pp. 352-366, 1990. 2. Pade via Lanozos (PVL), which was set forth in an article by P. Feldmann and R. W. Freund, entitled "Efficient linear circuit analysis by Pad'e approximation via the Lanczos process," IEEE Trans. on Computer-Aided Design of Integrated Circuits and Systems, Vol. 14 pp. 639-649, 1995. 3. Symmetric Pad'e via Lanczos, which was set forth in an article set forth by P. Feldmann and R. W. Freund, entitled "The SyMPVL algorithm and its applications to interconnect simulation," Proc. 1997 Int. Conf. on Simulation of Semiconductor Processes and Devices, pp. 113-116, 1997. 4. Block Arnoldi, which may be seen In U.S. Pat. No. 6,810,506. 5. Passive reduced-order interconnect macromodeling (PRIMA) method, which was set forth in an article by A. Odabasioglu, M. Celik and L. T. Pileggi, "PRIMA: passive reduced-order interconnect macromodeling algorithm," IEEE Trans. on Computer-Aided Design of Integrated Circuits and Systems, Vol. 17 pp. 645-653, 1998.

The above methods are performed essentially based on a Krylov Subspace projection method, in which state variables of an original system (original interconnect network for the above and original system will be used through this specification) is projected to obtain state variables of a reduced-order system (reduced interconnect model for the above and reduced-order system will be used through this specification) by use of a projection operand. The required projector may be obtained by performing the iteration-based Krylov algorithm, in which the iteration number required to be conducted is an "order" of the reduce-order system. In this case, the order of the reduced-order system has to be determined in execution of the projection-based interconnect model reduction in such a manner that essential dynamics of the original system may be accurately reflected. The iteration process may be conducted by taking a residual error between transfer functions of the original system and the reduced-order system, respectively, as a reference for an end of such iteration process, wherein the residual error is defined as an error between the transfer functions of the original and reduced-order systems after specific times of iterations.

An example of a deduction of the error $E(s)$ between the transfer functions of the original and reduced-order systems may be seen in an article set forth by Z. Bai, R. D. Slone, W. T. Smith and Q. Ye, entitled "Error bound for reduced system model by Pad'e approximation via the Lanczos process," IEEE Trans. on Computer-Aided Design of Integrated Circuits and Systems, Vol. 18 pp. 133-141, 1999. However, the error $E(s)$ involves complicated computations of a resolvent matrix $(I_n - sA)^{-1}$ of the original system, making it difficult to be used in a real application.

In Light of the above, there are still some shortcomings inherent in the prior art and thus improvements therefor are in an urgent need. In this regard, after looking at the problems encountered in the prior art, an efficient interconnect model-order reduction method was successfully developed in the present invention.

SUMMARY OF THE INVENTION

It is, therefore, an object to provide an interconnect model-order reduction method for reduction of a nano-level semiconductor interconnect network as an original interconnect network into a reduced interconnect model for signal analysis by using an iteration-based Arnoldi algorithm, through which transfer functions of the original interconnect network and the reduced interconnect model is exempted from complicated computations and the reduced interconnect model may be achieved in a rapid and accurate manner.

To achieve the above object, the interconnect model-order reduction method for reduction of a nano-level semiconductor interconnect model into a reduced interconnect model for signal analysis by using the iteration-based Arnoldi algorithm comprises the steps of: inputting an interconnect network, inputting a set of frequency expansion points, establishing a state space matrix of the interconnect network and reducing the interconnect network into the reduced interconnect model by estimating a residual error.

In this method, the residual error between the original interconnect network and the reduced interconnect model is derived and the reduced interconnect model is deduced by the iteration-based Arnoldi algorithm. Further, the relationship between the residual error and the original interconnect network is presented.

In addition, the transfer function of the reduced interconnect model may be represented simply by adding some perturbations to the transfer function of the original interconnect network, in which a perturbation matrix is only related to resultant vectors obtained in the Arnoldi algorithm.

The derived error may efficiently provide a reference for an order of the reduced interconnect model selected by the Krylov subspace model reduction algorithm.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

DETAILED DESCRIPTION OF THE INVENTION

Figure 1:
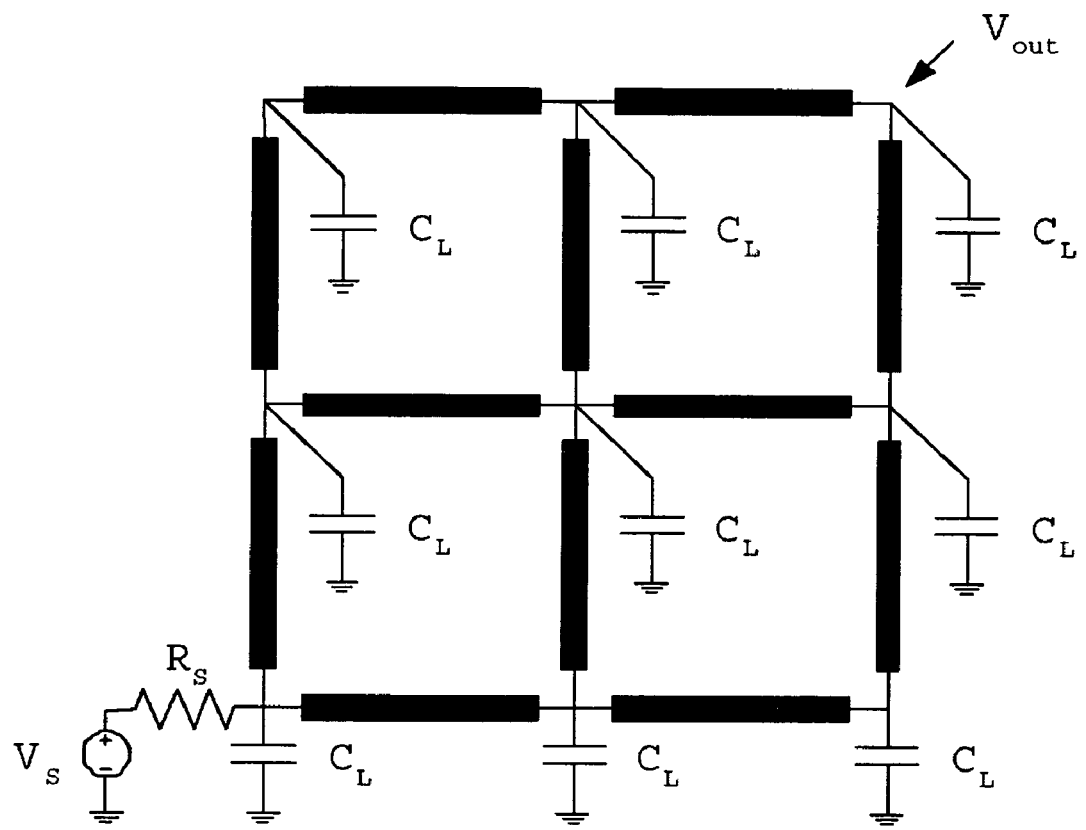
FIG. 1 shows a simple interconnect network according to an embodiment of the present invention.

In analyzing a linear RLC interconnect network in an ultra-large semiconductor circuit (ULSI), modified nodal analysis (MNA) technology is generally utilized. In performing the MNA technology, the interconnect network may be first represented as the following state space-based equation:

$$M\frac{dx(t)}{dt} = -Nx(t) + bu(t),\ y(t) = c^T x(t),\qquad\text{Eq. (1)}$$

wherein $M, N \in R^{n \times n}, x, b, c \in R^n$ and $y(t) \in R$; and wherein M is a matrix including capacitances and inductances therein, N is a matrix including electric conductivities and resistances therein, x(t) is a state matrix including node voltages and branch currents of an inductor therein, u(t) is an input signal and y(t) is an output signal.

Now, assuming $A = N^{-1}M$ and $r = N^{-1}b$, Eq. (1) may be represented as the following equation:

$$A\frac{dx(t)}{dt} = x(t) - ru(t),\ y(t) = c^T x(t).\qquad\text{(Eq. 2)}$$

Now, the original interconnect network is to be reduced so as to obtain a reduced interconnect network so that essential dynamics of the original interconnect network may be accurately reflected in a lower order. A state space matrix of the reduced interconnect model is given as the following equation:

$$\hat{A}\frac{d\hat{x}(t)}{dt} = \hat{x}(t) - \hat{r}u(t),\ \hat{y}(t) = \hat{c}^T \hat{x}(t),\qquad\text{(Eq. 3)}$$

wherein $\hat{x}(t) \in R^q, \hat{A} \in R^{q \times q}, \hat{r}, \hat{c} \in R^q$ and $q \ll n$.

Now letting $X(s) = L[x(t)]$ and $\hat{X}(s) = L[\hat{x}(t)]$ be impulse responses of the original interconnect network and the reduced interconnect model, respectively, in Laplace domain then, X(s) and $\hat{x}(s)$ may be represented as the following equation:

$$X(s) = (I_n - sA)^{-1}r \text{ and } \hat{X}(s) = (I_n - s\hat{A})^{-1}\hat{r}\qquad\text{(Eq. 4)}$$

wherein $I_n$ is an n×n unit matrix and $I_q$ is a q×q unit matrix.

A transfer function H(s) of the original interconnect network and a transfer function Ĥ(s) of the reduced interconnect model are represented, respectively, as $H(s) = c^T X(s)$ and $\hat{H}(s) = \hat{c}^T \hat{X}(s)$.

A projection-based method is employed to project the state variables of the original interconnect network by use of a projector into the state variables of the reduced interconnect model, the orthogonal projector being generated by the iteration-based Krylov subspace algorithm.

In the above, the Krylov subspace $K_q(A, r)$ is generated by a combination of matrix A and r and represented by the following equation:

$$K_q(A, r) \equiv \text{span}(r, Ar, \Lambda, A^{q-1}r).\qquad\text{(Eq. 5)}$$

Next, the Krylov subspace $K_q(A, r)$ is subject to a modified Gram-Schmidt orthogonal iteration process through the Arnoldi algorithm to generate a unit orthonormal basis, which is represented as the following equation:

$$V_q = [v_1, v_2, \Lambda, v_q],\qquad\text{(Eq. 6)}$$

wherein $V_q^T V_q = I_q$. By performing the Arnoldi algorithm with q times of iteration, the following equation may be obtained:

$$AV_q = V_q H_q + h_{q+1,q} v_{q+1} e_q^T,\qquad\text{(Eq. 7)}$$

wherein $H_q \in R^{q \times q}$ is an upper Hessenberg matrix $H_q$, which is represented as follows.

$$H_q = \begin{bmatrix} h_{11} & h_{22} & \Lambda & \Lambda & h_{1q} \\ h_{21} & h_{22} & \Lambda & \Lambda & h_{2q} \\ 0 & h_{32} & h_{33} & \Lambda & M \\ M & O & O & O & M \\ 0 & \Lambda & 0 & h_{q,q-1} & h_{qq} \end{bmatrix}$$

After q times of iteration performed in the Arnoldi algorithm, a residual vector $h_{q+1,q} v_{q+1}$ is obtained, which has a relationship with the last unit orthogonal vector, given as the following equation:

$$Av_q = h_{1q} v_1 + h_{2q} v_2 + \Lambda + h_{qq} v_q + h_{q+1,q} v_{q+1},\qquad\text{(Eq. 9)}$$

The newly generated vector $v_{q+1}$ is orthogonal to the unit orthogonal matrix $v_{q+1} V_q$ obtained in the last iteration, i.e. $V_q^T v_{q+1} = 0$. A vector $e_q$ is the $q^{th}$ column vector of the unit matrix $I_q$. From this viewpoint, between the state variables of the original interconnect network and the reduced interconnect model exists the following relationship:

$$x(t) = V_q \hat{x}(t),\qquad\text{(Eq. 10)}$$

wherein x(t) is a state variable in n dimensions for the original interconnect network and x̂(t) is a state variable in q dimensions for the reduced interconnect model.

Substituting Eq. 7 into Eq. 2, the following transformation relationship may be obtained with Eq. 3 through derivations and computations:

$$\hat{A} = V_q^T A V_q = H_q,\ \hat{r} = V_q^T r \text{ and } \hat{c} = V_q^T c\qquad\text{(Eq. 11)}$$

Reducing the original interconnect network by such projection-based model-order reduction method has the advantages that dynamics of the original interconnect network may be maintained and stability and passiveness may be achieved.

Error Analysis

To estimate the error between transfer functions of the original interconnect network (Eq. 2) and the reduced interconnect model (Eq. 3), an analytical expression of an residual error $E_r(s)$ has to be first defined:

$$E_r(s) = (I_n - sA)\tilde{X}(s) - r,\qquad\text{(Eq. 12)}$$

wherein $\tilde{X}(s)$ is an approximate solution of X(s). If $\tilde{X}(s) = X(s)$, then $E_r(s) = 0$.

When the Arnoldi algorithm begins to be performed, the approximate solution $\tilde{X}(s)$ of Eq. 4 has to fall within the Krylov subspace and $\tilde{X}(s)=V_q\hat{X}(s)$ in this case. The following discussion will be devoted to an ideal approximate solution of Eq. 4.

Now, assume the orthogonal matrix $V_q$ and the corresponding upper Hessenberg matrix $H_q$ in Eq. 6 are obtained after q times of iteration in performing the Arnoldi algorithm.

Next, assuming $\tilde{X}(s)$ is an approximate solution of $X(s)$, $\hat{X}(s)$ is an approximate solution of $X(s)$ after q times of iteration in performing the Arnoldi algorithm, i.e. $\tilde{X}(s)=V_q\hat{X}(s)$ and $E_r(s)$ is the residual error, then, the following statements are valid.

(a) If $\tilde{X}(s)=V_q\hat{X}(s)=V_q(I_q-sH_q)^{-1}V_q^T r$, then a Galerkin condition is valid.

$$V_q^T E_r(s) = V_q^T \{(I_n - sA)\tilde{X}(s) - r\} = 0. \quad \text{(Eq. 13)}$$

(b) When the Galerkin condition is valid, the residual error $E_r(s)$ may be represented as:

$$E_r(s) = -sh_{q+1,q}v_{q+1}e_q^T(I_q - sH_q)^{-1}\hat{r}. \quad \text{(Eq. 14)}$$

The valid statements above mentioned will be explained as follows.

After q times of iteration in performing the Arnoldi algorithm, the original interconnect network may be deduced to the reduced interconnect model as shown in Eq. 11.

(a) Since $\tilde{X}(s) \in K_q(A,r)$, $\tilde{X}(s)$ may be obtained through a linear combination of column vectors of $V_q$, i.e. $\tilde{X}(s) = V_q X_q(s)$, wherein $X_q(s)$ is a coefficient. Herein, it is expected that $X_q(s)=\hat{X}(s)$. The residual error $E_r(s)$ is represented as:

$$E_r(s) = (I_n - sA)V_q X_q(s) - r. \quad \text{(Eq. 15)}$$

By multifying Eq. 15 with a matrix $V_q^{T-}$ proceeding thereto, the following equation is obtained:

$$V_q^T[(I_n - sA)V_q X_q(s) - r] = V_q^T[V_q X_q(s) - s(V_q H_q + h_{q+1,q}v_{q+1}e_q^T)X_q(s) - r] \quad \text{(Eq. 16)}$$
$$= (I_q - sH_q)X_q(s) - \hat{r}.$$

Since the unit orthogonality inherent in the Arnoldi algorithm is used, the Galerkin condition is valid when $X_q(s)=\hat{X}(s)$.

(b) When the residual error is represented as the following equation:

$$E_r(s) = (I_n - sA)V_q(I_q - sH_q)^{-1}\hat{r} - r \quad \text{(Eq. 17)}$$
$$= [V_q(I_q - sH_q) -$$
$$sh_{q+1,q}v_{q+1}e_q^T](I_q - sH_q)^{-1}V_q^T r - r,$$

the following equation may be obtained after algebraic operations:

$$E_r(s) = -sh_{q+1,q}v_{q+1}e_q^T(I_q - sH_q)^{-1}\hat{r}, \quad \text{(Eq. 18)}$$

wherein $r \in \text{span}\{V_q\}$ and $V_q V_q^T r = r$.

Hitherto, the valid statements (a) and (b) have been explained completely.

Range of the error may be derived from the following equations. Assuming each eigenvalue of $H_q$ is simple and may be decomposed as $H_q = S_q \Lambda_q S_q^{-1}$, Eq. 14 may be simplified as:

$$E_r(s) = -sh_{q+1,q}v_{q+1}e_q^T S_q(I_q - s\Lambda_q)^{-1} S_q^{-1}\hat{r} \quad \text{(Eq. 19)}$$
$$= -h_{q+1,q}v_{q+1}e_q^T S_q Z(s) S_q^{-1}\hat{r},$$

wherein $$Z(s) = \text{diag}\left[\frac{s}{1-s\lambda_i}\right]_{i=1}^q.$$

Since $Z(s)$ is a high-pass matrix, $$\|Z(s)\|_\infty = \frac{1}{\min_{1\le i\le q}|\lambda_i|}.$$

Now, a norm form is obtained with respect to Eq. 19, and the following equation is obtained:

$$\|E_r(s)\|_\infty \le \kappa(S_q)\frac{1}{\min_{1\le i\le q}|\lambda_i|}|h_{q+1,q}|\|\hat{r}\|_2, \quad \text{(Eq. 20)}$$

wherein $\kappa(\cdot)$ is a condition number of a subject matrix.

As can be known in the above, the error estimation is only related to $\kappa(S_q)$, $\hat{r}$ and $h_{q+1,q}$. As compared to the error expressions set forth in the prior art, few of them take cost of the required computations into consideration. Since although $\kappa(S_q)$ may reflect perturbations existed in the MNA formula, computations therefor are quite time consuming. In this regard, only $h_{q+1,q}$ is taken as a reference for order selection of the reduced interconnect model. In fact, $h_{q+1,q}$ is not directly employed but $$\mu_q = \left\|\frac{h_{q+1,q}}{h_{q,q-1}}\right\|$$

is otherwise used as a reference for an end of the iteration process. If $\mu_q$ is sufficiently small, the reduced interconnect model is very similar to the original interconnect.

The operation of the iteration-based Arnoldi algorithm according to the present invention is described in detail below. At first, an initial value is given. Then, the iteration process is performed during which the order of the reduced interconnect model is incremented. In each iteration performed, a new unit orthogonal vector $v_q$ is generated, and a corresponding value $$\mu_q = \left\| \frac{h_{q+1,q}}{h_{q,q-1}} \right\|$$

according to the present invention is computed. When $\mu_q$ is sufficiently small, the iteration process in the Arnoldi algorithm will end, and the corresponding iteration times q is taken as an optimal order number of the reduced model.

The advantages of the present invention will be demonstrated and simulation results thereof will be presented through a simple embodiment provided below.

Additive Perturbations System

In the following, a reduced-order system comparable to Eq. 11 will be deduced by adding perturbations to the original system.

$$(A - \Delta)\frac{dx_\Delta(t)}{dt} = x_\Delta(t) - ru(t), \quad \text{(Eq. 21)}$$
$$y_\Delta(t) = c^T x_\Delta(t).$$

Adding some perturbations into a transfer function of the original system may present a transfer function $\hat{H}(s)$ after approximation, as shown in FIG. 14. Under the condition shown in Eq. 21, a transfer function $H_A(s)$ of the perturbation system is comparable to the transfer function $\hat{H}(s)$ of the reduced system.

$$\Delta = h_{q+1,q} v_{q+1,q} v_q^T. \quad \text{(Eq. 22)}$$

This result will be explained in principle as follows.

Assuming $X_A(s) = V_q \hat{X}(s)$, the following equation may be derived:

$$(I_n - s(A-\Delta))^{-1} r = V_q (I_q - s\hat{A})^{-1} \hat{r}. \quad \text{(Eq. 23)}$$

Next, $(I_n - s(A - \Delta))$ is multified at the right and left sides of Eq. 23 and the following equation is obtained:

$$r = (I_n - s(A - \Delta))V_q (I_q - s\hat{A})^{-1} \hat{r} \quad \text{(Eq. 24)}$$
$$= [V_q - s(V_q H_q + h_{q+1,q} v_{q+1} e_q^T) + s\Delta V_q](I_q - s\hat{A})^{-1} V_q^T r.$$

Then, Eq. 24 is multified with $V_q^T$ and then rearranged as:

$$(I_q - s\hat{A}) = I_q - s(H_q + h_{q+1,q} V_q^T v_{q+1} e_q^T) + sV_q^T \Delta V_q. \quad \text{(Eq. 25)}$$

Finally, the following equation is obtained:

$$V_q^T \Delta V_q = h_{q+1,q} V_q^T v_{q+1} e_q^T \quad \text{(Eq. 26)}$$
$$= h_{q+1,q} V_q^T v_{q+1} e_q^T V_q^T V_q,$$

and may be further simplified as $X_A(s) = V_q \hat{X}(s)$ with the assumption of $\Delta = h_{q+1,q} v_{q+1} v_q^T$.

The Simple Embodiment of the Present Invention

In the following, the simple embodiment is provided for test and demonstration of the Arnold algorithm, which will be described with reference to FIG. 1 corresponding to an examplary RLC interconnect network having twelve wires therein.

Parameters of the wires are given as follows: resistor: 1.0 O/cm, capacitor: 5.0 pF/cm, inductor: 1.5 nH/cm; drive resistor: 3O and load capacitor: 1.0 pF. Further, each of the wires is 30 mm long and separated into 50 sub-wires. In this embodiment, a frequency range of 0-12 GHz is selected and a frequency response voltage $V_{out}$ of the RLC interconnect network is determined.

Figure 2:
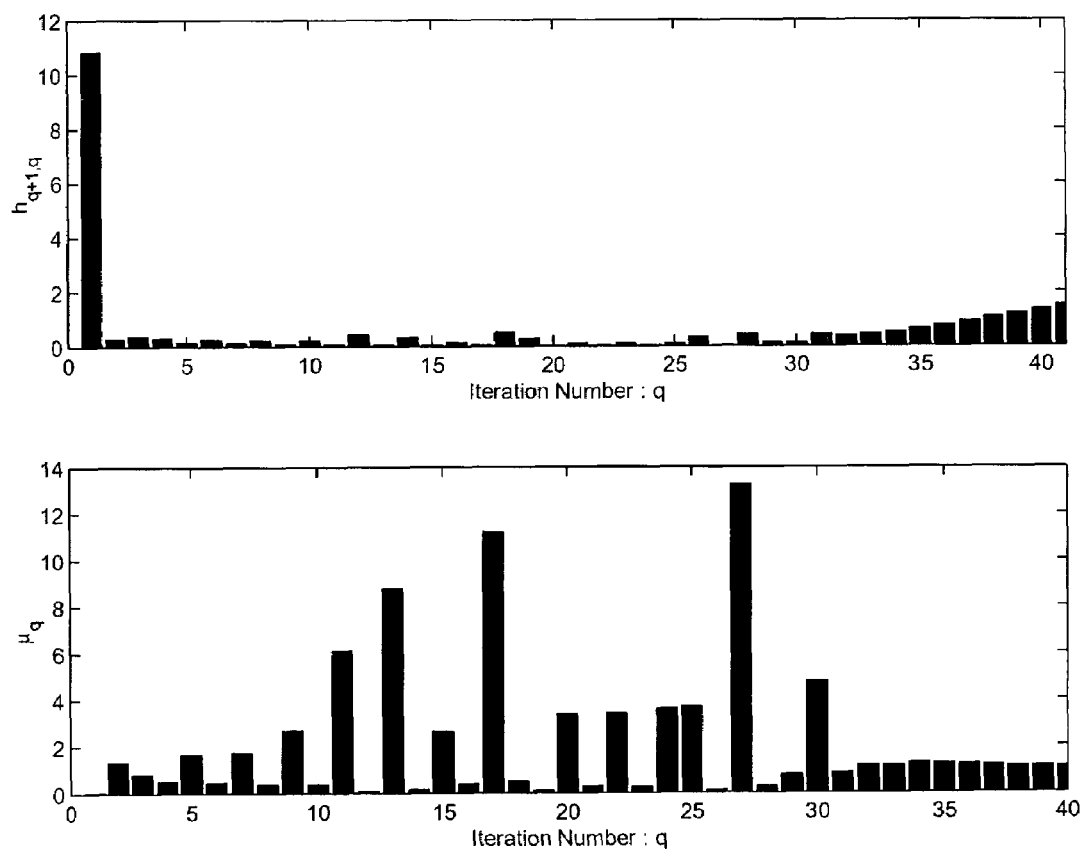
FIG. 2 shows a comparison between $H_{q+1,q}$ and $\mu_q$ after different iteration times q performed according to the present invention.

When the Arnoldi algorithm begins to be performed, values of $h_{q+1,q}$ and $\mu_q$ are recorded in sequence. The simulation results of the Arnoldi algorithm are shown in FIG. 2. As shown, it may be seen that when iteration number q in the Arnoldi algorithm is greater than 31, $\mu_q$ is relatively smaller. Accordingly, it is suggested that the order of the reduced interconnect model be set as 31. H(s), $\hat{H}(s)$ and $H_A(s)$ represent the transfer function of the original interconnect model, the transfer function of the reduced interconnect model after being subject to the Arnoldi algorithm and the transfer function of the perturbation system of the original interconnect network.

Figure 3:
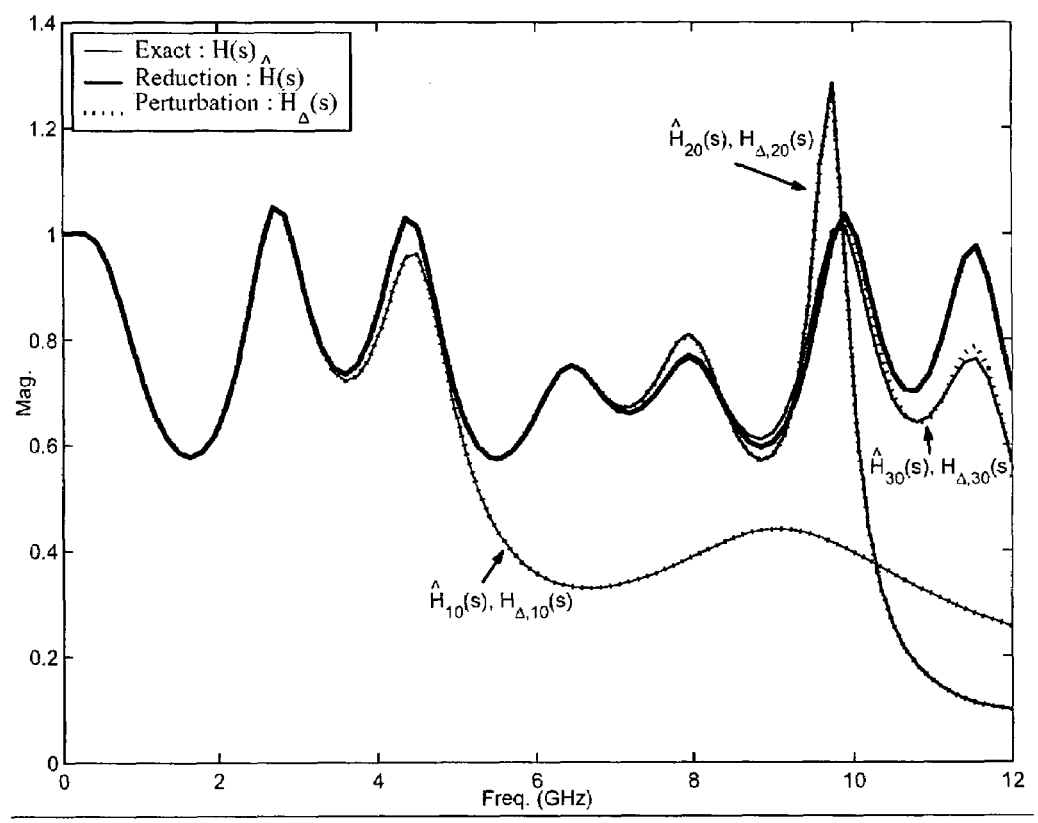
FIG. 3 shows a comparison of three systems H(s), Ĥ(s) and $H_A(s)$, after q times of iteration performed, according to the present invention.

Referring to FIG. 3, a comparison of the three systems H(s), $\hat{H}(s)$ and $H_A(s)$, after q times of iteration performed, according to the present invention is shown therein. It may be ascertained that $H_A(s)$ is equal to $\hat{H}(s)$.

In the present invention, the residual error between the original RLC interconnect network and the reduced interconnect model is deduced and the perturbation is demonstrated as capable of representing the transfer function after approximation when being added into the transfer function of the original interconnect network. Herein, since the perturbation matrix is only related to the resultant vectors obtained in a last iteration in the Arnoldi algorithm, the amount of computation required therefor is very small. With respect to the thus generated residual error, a reference for order selection may be provided in the projection-based model reduction method.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. An Interconnect model-order reduction method for reduction of a nano-level semiconductor interconnect network as an original interconnect network by using interaction-based Arnoldi algorithms, comprising:
   a. placing parameters of passive components of the interconnect network into matrices, wherein the matrices contain resistances, capacitances, and inductances;
   b. building a state space-based system matrix for the original interconnect network;
   c. building a state space-based system matrix for a reduced interconnect network including generating an orthogonal projector by an iteration-based Krylov algorithm including:
      i. generating a Krylov subspace based upon the iteration-based Krylov algorithm;
      ii. modifying the Krylov subspace by applying a modified Gram-Schmidt orthogonal iteration process through application of an Arnoldi algorithm to generate a unit orthonormal basis;
      iii. creating a residual vector by iterative application of the Arnoldi algorithm;

iv. comparing the residual vector with the interconnect network to determine a state of the reduced interconnect network by estimating residual error;
v. outputting a resulting projection for the reduced interconnect network; and
vii. using the output to deduce a lower-order system; and
d. storing the state space-based system matrix for the reduced interconnect network in computer memory, wherein estimating the residual error comprises using:
  (a) the Arnoldi algorithm containing the iteration-based Krylov algorithm therein;
  (b) a perturbation system added into the interconnect network; and
  (c) the residual error defined as $E_r(s)=(I_n-sA)\hat{X}(s)-r$.

2. The method according to claim 1, wherein the residual error is used to obtain the reduced interconnect model by using the Arnoldi algorithm containing the iteration-based Krylov algorithm through which consecutive iterations are performed to generate consecutive approximate reduced interconnect models with only one more iteration required for a newly generated approximate reduced interconnect model with an order higher than that of a last approximate reduced interconnect model among the consecutively generated approximate reduced interconnect models.

3. The method according to claim 1, wherein estimating the residual error is performed based on addition of the perturbation system achieved by adding a predetermined amount of perturbations onto the interconnect network, through which a transfer function after approximation $\hat{H}(s)$ of the reduced interconnect network is represented as:

$$(A - \Delta)\frac{dx_\Delta(t)}{dt} = x_\Delta(t) - ru(t),$$
$$y_\Delta(t) = c^T x_\Delta(t),$$

and, if $\Delta = h_{q+1,q} v_{q+1} v_q^T$ is valid, a transfer function $H_\Delta(s)$ of the perturbation system is comparable to the transfer function $\hat{H}(s)$ of the reduced interconnect network.

4. The method according to claim 1, wherein estimating the residual error defined as $E_r(s)=(I_n-sA)\hat{X}(s)-r$ is performed based on a unit orthogonality of the Arnoldi algorithm, wherein the residual error is represented as $$E_r(s) = (I_n - sA)V_q(I_q - sH_q)^{-1}\hat{r} - r$$
$$= [V_q(I_q - sH_q) - sh_{q+1,q}v_{q+1}e_q^T](I_q - sH_q)^{-1}V_q^T r - r,$$

and then, after algebraic operations, as $$E_r(s) = -sh_{q+1,q}v_{q+1}e_q^T(I_q - sH_q)^{-1}S_q^{-1}\hat{r}.$$

* * * * *